(12) United States Patent
Wang

(10) Patent No.: US 8,891,232 B2
(45) Date of Patent: Nov. 18, 2014

(54) SUPPORT STAND AND STANDABLE HAND-HELD DEVICE

(75) Inventor: Cheng-Lin Wang, Taoyuan County (TW)

(73) Assignee: HTC Corporation, Taoyuan County (TW)

( * ) Notice: Subject to any disclaimer, the term of this patent is extended or adjusted under 35 U.S.C. 154(b) by 206 days.

(21) Appl. No.: 13/241,223

(22) Filed: Sep. 23, 2011

(65) Prior Publication Data

US 2013/0077211 A1    Mar. 28, 2013

(51) Int. Cl.
| | | |
|---|---|---|
| *H05K 5/00* | (2006.01) | |
| *H05K 7/00* | (2006.01) | |
| *G06F 1/16* | (2006.01) | |
| *H05K 7/02* | (2006.01) | |
| *H05K 7/04* | (2006.01) | |
| *F16L 3/00* | (2006.01) | |
| *A47F 5/00* | (2006.01) | |
| *A47F 7/00* | (2006.01) | |
| *F16M 11/00* | (2006.01) | |
| *F16M 13/00* | (2006.01) | |
| *A45D 19/04* | (2006.01) | |
| *A47J 47/16* | (2006.01) | |
| *F16M 11/04* | (2006.01) | |
| *F16M 11/06* | (2006.01) | |
| *H05K 7/14* | (2006.01) | |
| *A47G 29/00* | (2006.01) | |
| *F16M 11/22* | (2006.01) | |
| *F16M 11/24* | (2006.01) | |
| *H04N 5/645* | (2006.01) | |
| *F16M 11/16* | (2006.01) | |
| *F16M 11/10* | (2006.01) | |

(52) U.S. Cl.
CPC ............ *G06F 1/1613* (2013.01); *F16M 11/04* (2013.01); *F16M 11/06* (2013.01); *H05K 7/14* (2013.01); *G06F 1/1601* (2013.01); *G06F 1/1607* (2013.01); *G06F 1/1637* (2013.01); *F16M 13/005* (2013.01); *A47G 29/00* (2013.01); *F16M 11/00* (2013.01); *F16M 11/22* (2013.01); *F16M 11/24* (2013.01); *H04N 5/645* (2013.01); *H05K 7/00* (2013.01); *G06F 1/16* (2013.01); *F16M 11/16* (2013.01); *F16M 11/10* (2013.01); *F16M 2200/028* (2013.01); *Y10S 248/917* (2013.01); *Y10S 248/918* (2013.01); *Y10S 248/919* (2013.01); *Y10S 248/92* (2013.01); *Y10S 248/921* (2013.01); *Y10S 248/922* (2013.01); *Y10S 248/923* (2013.01)

USPC .............. 361/679.3; 361/679.01; 361/679.02; 361/679.21; 361/679.26; 361/679.55; 361/679.56; 361/679.6; 361/807; 361/809; 361/810; 248/121; 248/122.1; 248/125.1; 248/127; 248/176.1; 248/917; 248/918; 248/919; 248/920; 248/921; 248/922; 248/923

(58) Field of Classification Search
CPC ....... A47G 29/00; F16M 11/00; F16M 11/04; F16M 11/06; F16M 11/22; F16M 11/24; G06F 1/16; G06F 1/1601; G06F 1/1607; G06F 1/1613; G06F 1/1637; H04N 5/645; H05K 7/00; H05K 7/14
USPC .......................... 361/679.01, 679.02, 679.21, 361/679.55–679.56, 679.26, 679.6, 807, 361/809–810, 679.3; 248/121, 122.1, 248/125.1, 127, 176.1, 917–923

See application file for complete search history.

(56) References Cited

U.S. PATENT DOCUMENTS

| | | | | |
|---|---|---|---|---|
| 7,636,133 | B1 * | 12/2009 | Hsu ............................... | 348/794 |
| 7,753,336 | B2 * | 7/2010 | Hu ................................. | 248/688 |
| 2009/0302175 | A1 * | 12/2009 | Torii et al. ................... | 248/122.1 |
| 2010/0012810 | A1 * | 1/2010 | Hu ................................. | 248/408 |

FOREIGN PATENT DOCUMENTS

| | | |
|---|---|---|
| CN | 201487490 | 5/2010 |
| TW | M327668 | 3/2008 |
| TW | I344722 | 7/2011 |

OTHER PUBLICATIONS

"Office Action of Taiwan Counterpart Application", issued on May 13, 2014, p. 1-p. 11.
"Office Action of China Counterpart Application", issued on May 4, 2014, p. 1-p. 9.

\* cited by examiner

*Primary Examiner* — Anthony Haughton
*Assistant Examiner* — Zhengfu Feng
(74) *Attorney, Agent, or Firm* — Jianq Chyun IP Office

(57) ABSTRACT

A support stand suitable for a hand-held device is provided. The support stand has a first support member and a second support member. The second support member slidably fits the first support member and could be temporarily fixed at different positions on the first support member to adjust the length of the support stand. The hand-held device has a display screen and an antenna. Because the length of the support stand is variable, the hand-held device could be laid on the table by various inclination angles. Besides, the projections of the support stand and the antenna on the display screen are not overlapped, and the influence of the support stand made of metal on the signal of the antenna would be lowered.

26 Claims, 13 Drawing Sheets

SUPPORT STAND AND STANDABLE HAND-HELD DEVICE

BACKGROUND OF THE INVENTION

1. Field of the Invention

The invention relates to a support stand. More particularly, the invention relates to a support stand suitable for a hand-held device.

2. Description of Related Art

As technology advances, hand-held devices have increasing functions. For instance, a user is able to watch videos or TV channels through the hand-held device. However, the user is not comfortable when holding the hand-held device for a long time, and thus more and more hand-held devices are equipped with support stands, such that the hand-held devices can stand on a table.

At present, most in-use support stands of the hand-held devices on the market can merely be placed at certain inclination angles on a table. The inclination angles are fixed, and thus the users must accommodate themselves to the screens of the hand-held devices at the fixed inclination angles, which causes inconvenience to the users.

Moreover, the conventional support stands are often made of metallic materials in order to enhance the mechanical strength of the support stands. To ensure that the hand-held devices can stand on the table, the support stands are required to have certain lengths. Nonetheless, when the support stands made of metal are not in use and thus lean against the hand-held devices, the support stands may affect the antennas of the hand-held devices due to the short distance between the support stands and the antennas.

SUMMARY OF THE INVENTION

The invention is directed to a support stand suitable for connecting a hand-held device, such that the hand-held device is able to be placed at various inclination angles on a table.

The invention is further directed to a standable hand-held device that has a support stand. Through the support stand, the standable hand-held device can be placed at various inclination angles on a table.

The invention is further directed to a standable hand-held device that has a support stand. When the support stand leans against the hand-held device, the support stand does not pose a significant impact on the performance of an antenna of the device.

In the invention, a support stand suitable for being configured on a hand-held device is provided. The support stand includes a first support member and a second support member. The first support member has a first positioning portion, a first guiding element, and a plurality of first locking portions. The second support member slidably fits the first support member. Besides, the second support member has a second positioning portion, a second guiding element, and a second locking portion. The second positioning portion slidably fits the first positioning portion, so as to limit the second support member to slide on the first support member. The second guiding element slidably fits the first guiding element, such that the second support member slides along a sliding axis relative to the first support member. The second locking portion can be locked to one of the first locking portions, so as to adjust a position of the second support member relative to the first support member.

In the invention, a standable hand-held device that includes a hand-held device and a support stand is provided. The hand-held device includes a display screen. The support stand includes a first support member and a second support member. The first support member is pivoted to the hand-held device. The second support member slidably fits the first support member and can be temporarily fixed at different positions on the first support member to adjust the length of the support stand.

In the invention, a standable hand-held device that includes a hand-held device and a support stand is provided. The hand-held device includes a display screen and an antenna. The support stand is pivoted to the hand-held device. When the support stand leans against the hand-held device, a projection of the support stand on a plane where the display screen is located is not overlapped with a projection of the antenna on the plane where the display screen is located.

Based on the above, the support stand described in the embodiments of the invention may have different lengths, such that the hand-held device may be placed at various inclination angles on the table. Additionally, when the support stand leans against the hand-held device, the projection of the support stand on the display screen is not overlapped with the projection of the antenna on the display screen, so as to reduce the influence of the support stand on the antenna.

Several exemplary embodiments accompanied with figures are described in detail below to further describe the invention in details.

BRIEF DESCRIPTION OF THE DRAWINGS

The accompanying drawings constituting a part of this specification are incorporated herein to provide a further understanding of the invention. Here, the drawings illustrate embodiments of the invention and, together with the description, serve to explain the principles of the invention.

DESCRIPTION OF EMBODIMENTS

Figure 1A:
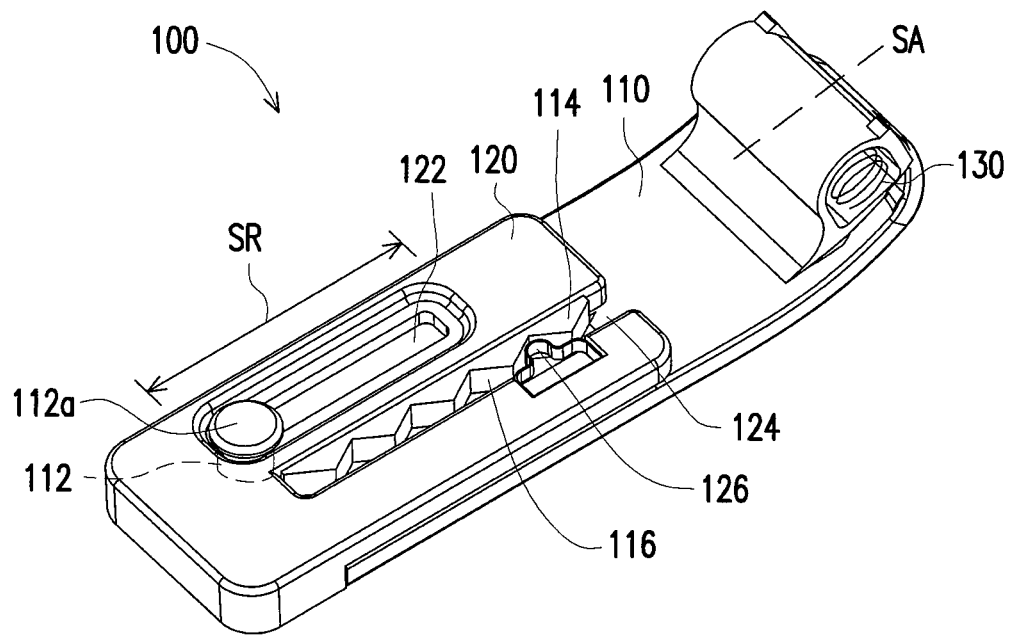
FIG. 1A is a perspective view illustrating a support stand according to a first embodiment of the invention.
Figure 1B:
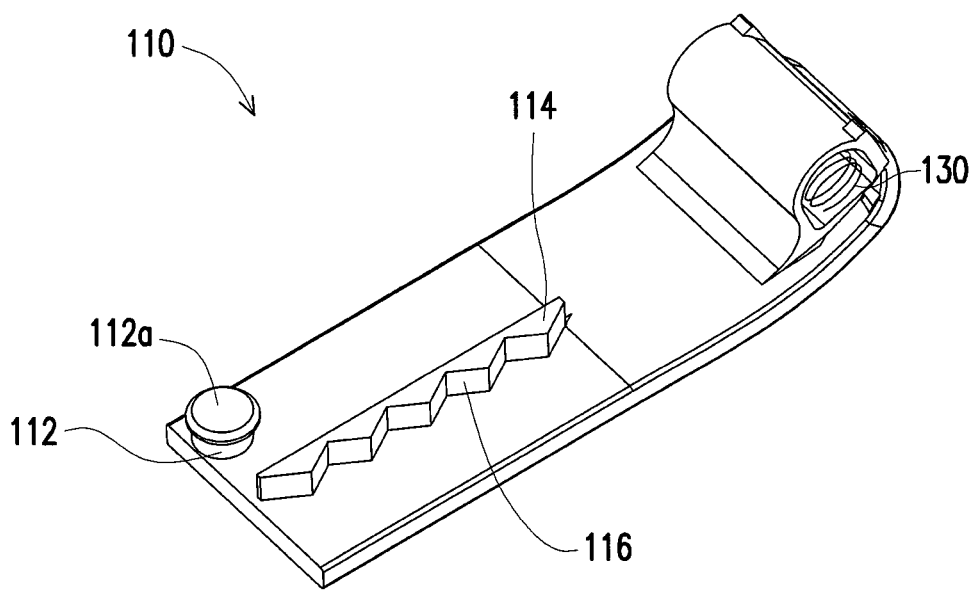
FIG. 1B is a perspective view illustrating the first support member and the restoring element depicted in FIG. 1A.
Figure 1C:
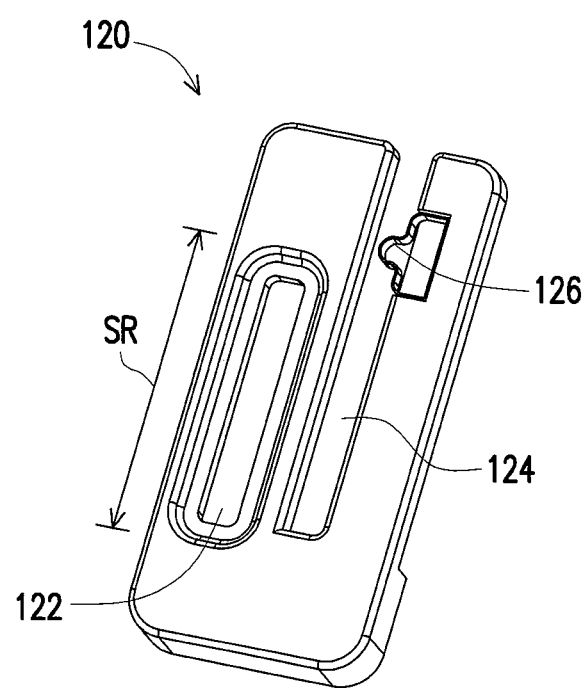
FIG. 1C is a perspective view illustrating the second support member depicted in FIG. 1A.

FIG. 1A is a perspective view illustrating a support stand according to a first embodiment of the invention. FIG. 1B is a perspective view illustrating the first support member and the restoring element depicted in FIG. 1A. FIG. 1C is a perspective view illustrating the second support member depicted in FIG. 1A. With reference to FIG. 1A, FIG. 1B, and FIG. 1C, in the present embodiment, a support stand 100 suitable for being configured on a hand-held device (e.g., the hand-held device 310 shown in FIG. 4) is provided, such that the hand-held device can stand on a table. The support stand 100 includes a first support member 110 and a second support member 120. The first support member 110 has a first positioning portion 112, a first guiding element 114, and a plurality of first locking portions 116. The second support member 120 slidably fits the first support member 110. Besides, the second support member 120 has a second positioning portion 122, a second guiding element 124, and a second locking portion 126.

The second positioning portion 122 slidably fits the first positioning portion 112, so as to limit the second support member 120 to slide on the first support member 110. In this embodiment, the first positioning portion 112 is a protrusion, the second positioning portion 122 is a groove, the protrusion is located in the groove and has a top portion 112a, and an outer diameter of the top portion 112a is greater than a width of the groove. A length of the groove defines a sliding range SR of the second support member 120 relative to the first support member 110.

The second guiding element 124 slidably fits the first guiding element 114, such that the second support member 120 slides along a sliding axis SA relative to the first support member 110. In this embodiment, the first guiding element 114 is a sliding block, the second guiding element 124 is a sliding groove, the sliding block is located in the sliding groove, and an extension direction of the sliding groove is substantially parallel to the sliding axis SA.

The second locking portion 126 can be locked to one of the first locking portions 116, so as to adjust a position of the second support member 120 relative to the first support member 110. In this embodiment, an arrangement direction of the first locking portions 116 can be parallel to the sliding axis SA, which should not be construed as a limitation to the invention.

The first locking portions 116 may be located on the first guiding element 114 in the present embodiment. As indicated in FIG. 1A, the first guiding element 114 may be a sliding block, the first locking portions 116 may be slots, and the slots are located on the sliding block. Besides, the second locking portion 126 can be may elastic member (e.g., a plate spring), and the elastic member may be locked to one of the slots.

In the present embodiment, the support stand 100 can further include a restoring element 130. The restoring element 130 may be disposed between the first support member 110 and the hand-held device (e.g., the hand-held device 310 depicted in FIG. 4) to rotate the support stand 100, so that the support stand 100 leans against the hand-held device. As shown in FIG. 1A and FIG. 1C, the restoring element 130 can be disposed at a location where the first support member 110 is pivoted to the hand-held device.

According to this embodiment, the restoring element 130 is a torsion spring, for instance. The support stand 100 is pivoted to the hand-held device. Therefore, given that a force is exerted to rotate the support stand 100, the restoring element 130 located at the location where the support stand 100 is pivoted to the hand-held device is deformed.

When the support stand 100 is actually used and rotated relative to the hand-held device, an angle is included by the support stand 100 and the hand-held device, and thereby the hand-held device can stand on the table through the support stand 100. When the hand-held device on the table is picked up, the restoring element 130 (e.g., a torsion spring) rotates the support stand 100, so as to restore the support stand 100 to be in its initial state. As such, the support stand 10 can lean against the hand-held device.

Figure 2D:
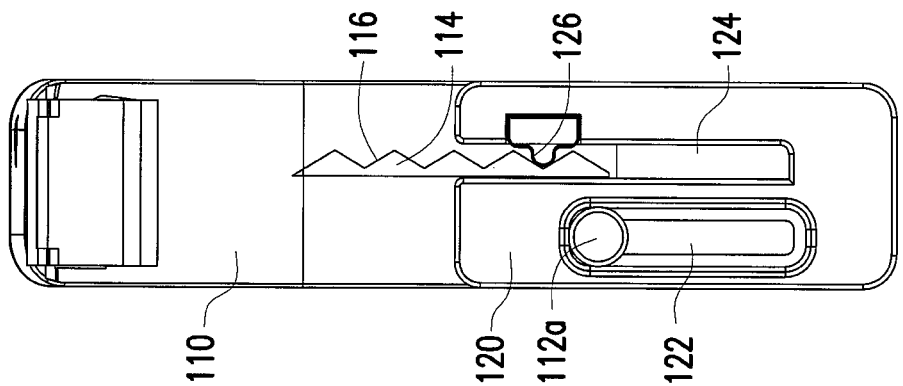
FIG. 2A to FIG. 2D are schematic views illustrating operation of the support stand according to the first embodiment of the invention.
Figure 2C:
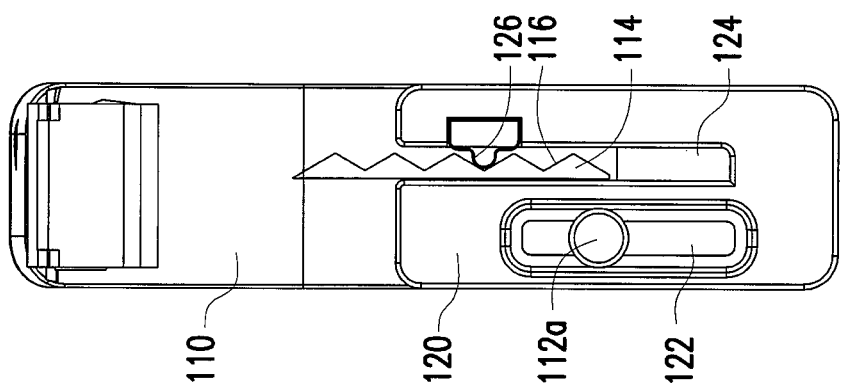
Figure 2B:
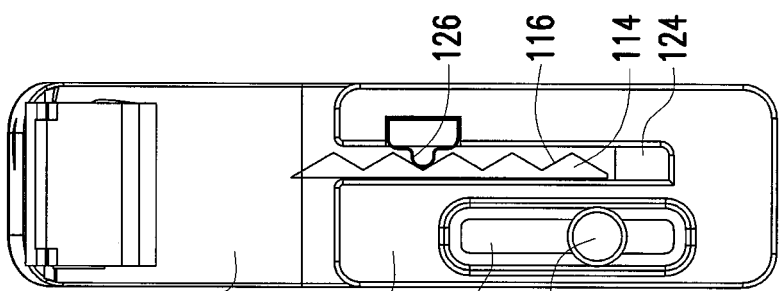
Figure 2A:
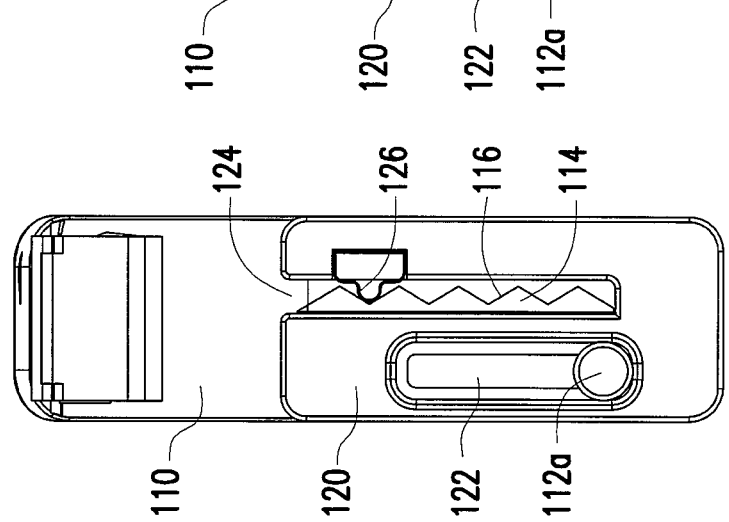

FIG. 2A to FIG. 2D are schematic views illustrating operation of the support stand according to the first embodiment of the invention. In FIG. 2A, the hand-held device 100 has the minimum length, and the second locking portion 126 is locked to the uppermost first locking portion 116. In order to move the second support member 120 from the position shown in FIG. 2A to the position shown in FIG. 2B, the second support member 120 can be pulled down along the sliding axis SA, and thus the second support member 120 can be moved relative to the first support member 110.

The second locking portion 126 of this embodiment is an elastic member. Hence, in the process of pulling the second support member 120 in a downward manner, the second locking portion 126 can be moved to the next first locking portion 116 along the deformation curve of the uppermost first locking portion 116. If the second locking portion 126 stops being pulled down, the second locking portion 126 stays at the position shown in FIG. 2B. If a user intends to extend the length of the support stand 100, the user can pull down the second locking portion 126, such that the second support member 120 can be pulled down from the position shown in FIG. 2B to the position shown in FIG. 2C. As the second support member 120 is moved to the position shown in FIG. 2D, the second support member 120 cannot be further pulled down because of the mutual limitation of the first and second positioning portions 112 and 122. At this time, the support stand 100 has the maximum length.

Certainly, the number of the first locking portions 116, the shape of the first locking portions 116, and how densely the first locking portions 116 are arranged can be adjusted based on different requirements and should not be limited to those described above. That is to say, when the second support member 120 is moved along the sliding axis SA, the second support member 120 can be fixed at different positions, and thereby the support stand 100 can have different lengths.

Figure 3A:
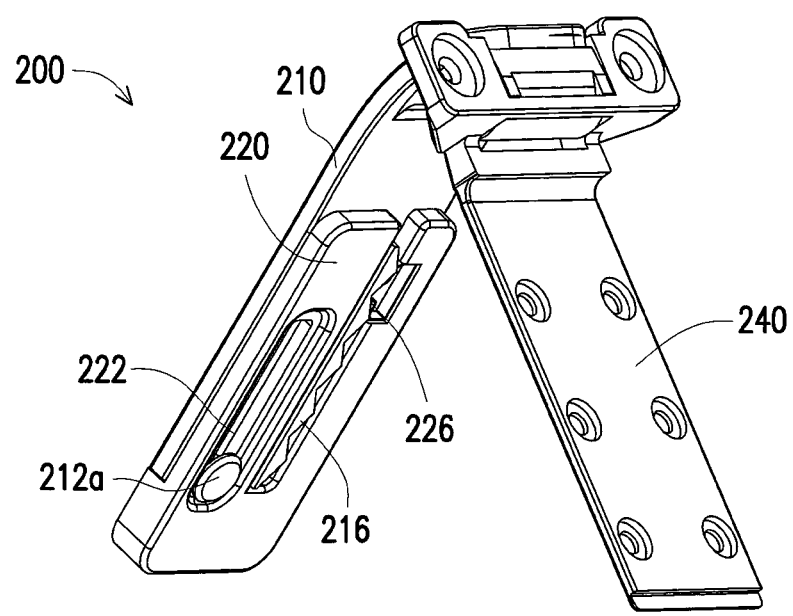
FIG. 3A is a perspective view illustrating a support stand according to a second embodiment of the invention.
Figure 3B:
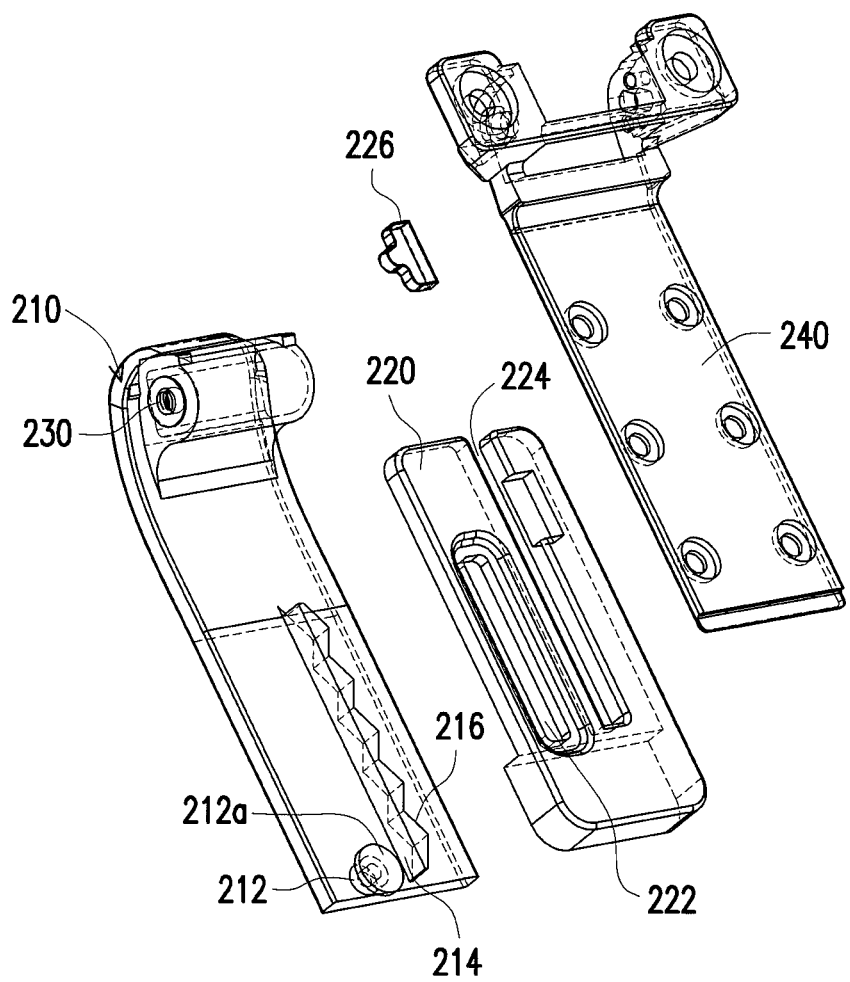
FIG. 3B is an exploded view illustrating the support stand depicted in FIG. 3A.

FIG. 3A is a perspective view illustrating a support stand according to a second embodiment of the invention. FIG. 3B is an exploded view illustrating the support stand depicted in FIG. 3A. With reference to FIG. 3A and FIG. 3B, the support stand 200 described in this embodiment includes a first support member 210 and a second support member 220. The first support member 210 has a first positioning portion 212, a first guiding element 214, and a plurality of first locking portions 216. The second support member 220 slidably fits the first support member 210. Besides, the second support member 220 has a second positioning portion 222, a second guiding element 224, and a second locking portion 226.

The second positioning portion 222 slidably fits the first positioning portion 212, so as to limit the second support member 220 to slide on the first support member 210. The second guiding element 224 slidably fits the first guiding element 214, such that the second support member 220 slides along a sliding axis 240 relative to the first support member 210. The second locking portion 226 can be locked to one of the first locking portions 216, so as to adjust a position of the second support member 220 relative to the first support member 210.

Compared to the support stand 100 depicted in FIG. 1A, the support stand 200 of this embodiment further includes a fixing element 240 to which the first support member 210 is pivoted. The fixing element 240 serves to fix the hand-held device. In the present embodiment, the fixing element 240 may have holes and can be screwed onto the hand-held device by moving screws through the holes. According to this embodiment, the restoring element 230 is disposed between the first support member 210 and the fixing element 240 to restore the first support member 210 to the fixing element 240.

Figure 4:
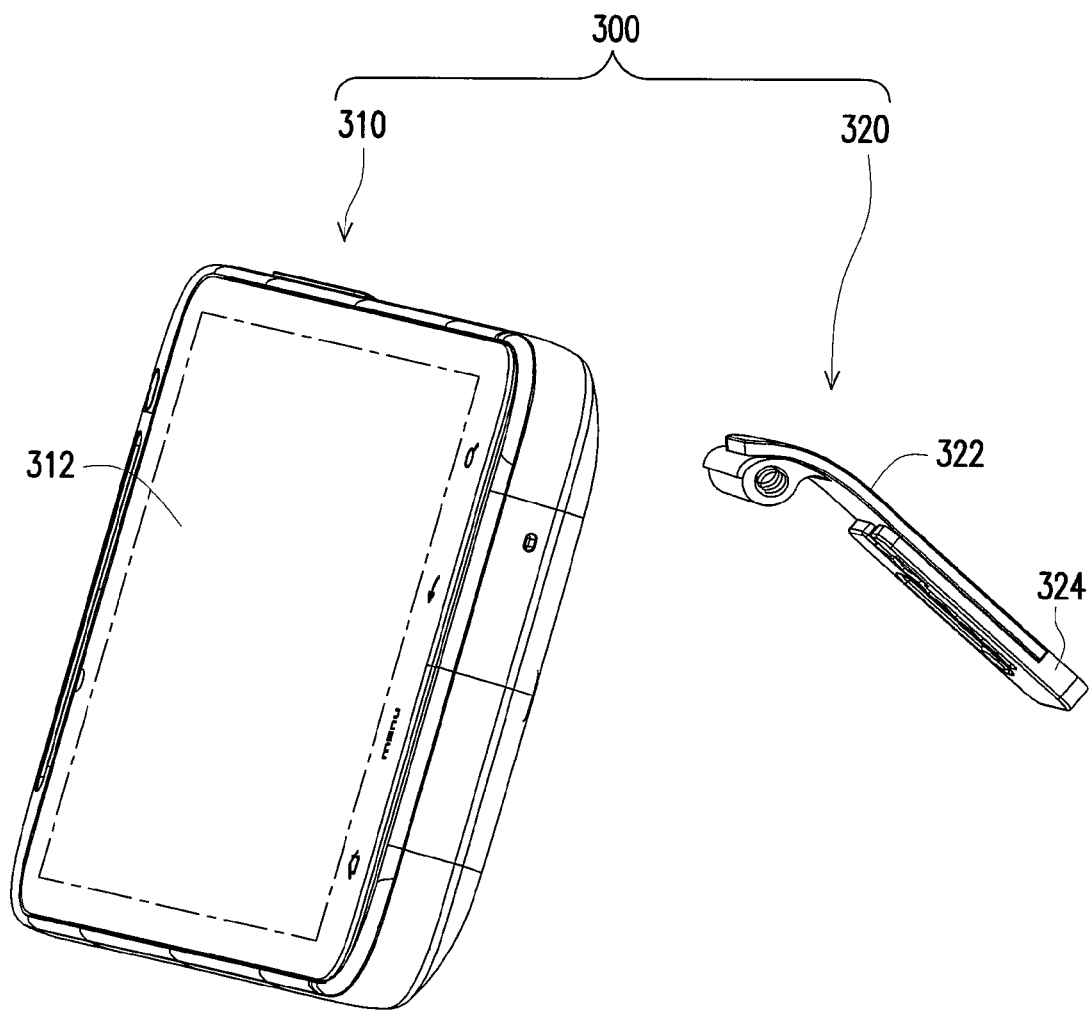
FIG. 4 is an exploded view illustrating a hand-held device and a support stand in a standable hand-held device according to a third embodiment of the invention.

FIG. 4 is an exploded view illustrating a hand-held device and a support stand in a standable hand-held device according to a third embodiment of the invention. With reference to FIG. 4, the standable hand-held device 300 of this embodiment includes a hand-held device 310 and a support stand 320. The hand-held device 310 includes a display screen 312. Since the support stand 320 in this embodiment is identical to the support stand 100 in the first embodiment, detailed descriptions of the support stand 320 are omitted hereinafter. In this embodiment, the first support member 322 is pivoted to the hand-held device 310, and the second support member 324 can be fixed at different positions on the first support member 322, such that the support stand 320 may have different lengths.

Figure 5:
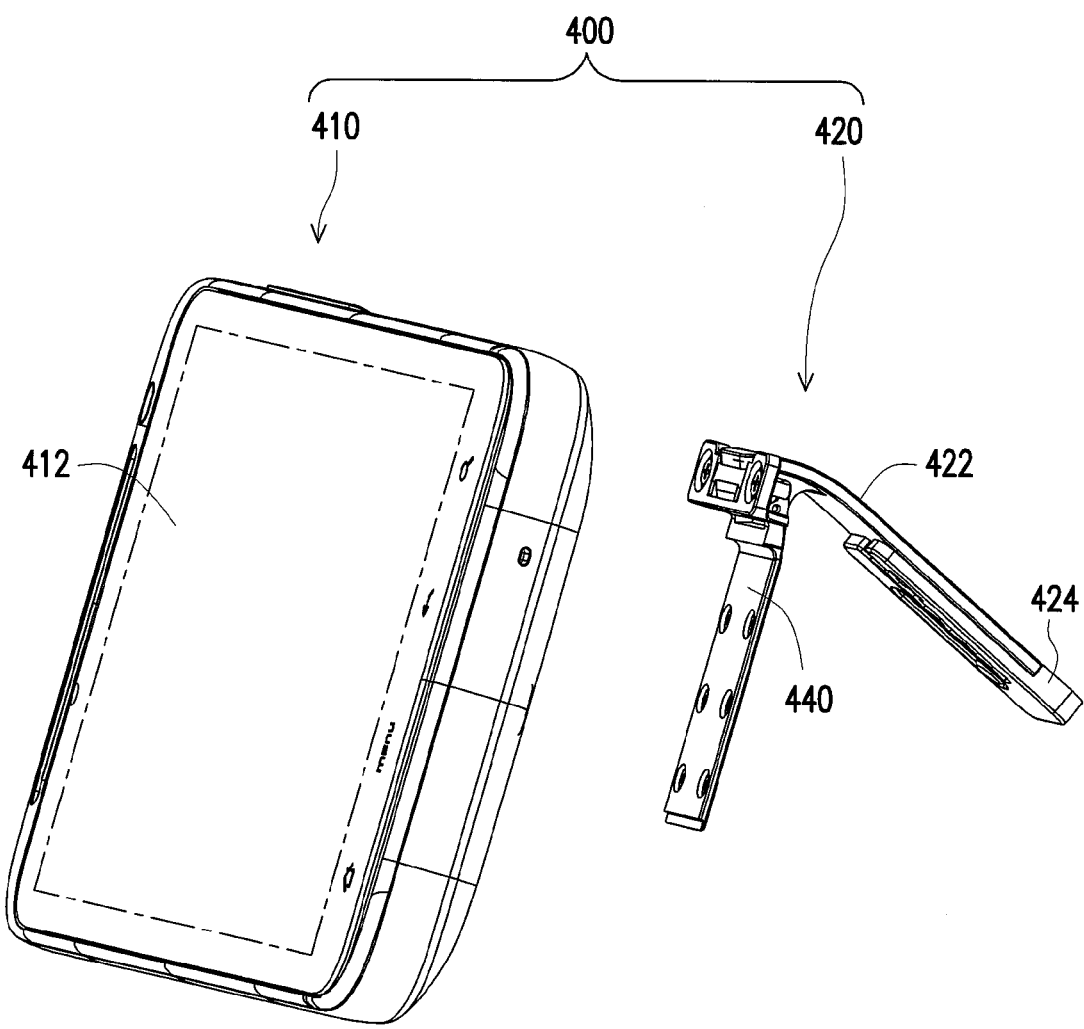
FIG. 5 is an exploded view illustrating a hand-held device and a support stand in a standable hand-held device according to a fourth embodiment of the invention.

FIG. 5 is an exploded view illustrating a hand-held device and a support stand in a standable hand-held device according to a fourth embodiment of the invention. With reference to FIG. 5, the standable hand-held device 400 of this embodiment includes a hand-held device 410 and a support stand 420. The hand-held device 410 includes a display screen 412. The support stand 420 of this embodiment is identical to the support stand 200 of the second embodiment. Specifically, the first support member 422 is pivoted to the fixing element 440, and the fixing element 440 is locked to the hand-held device 410.

Figure 6A:
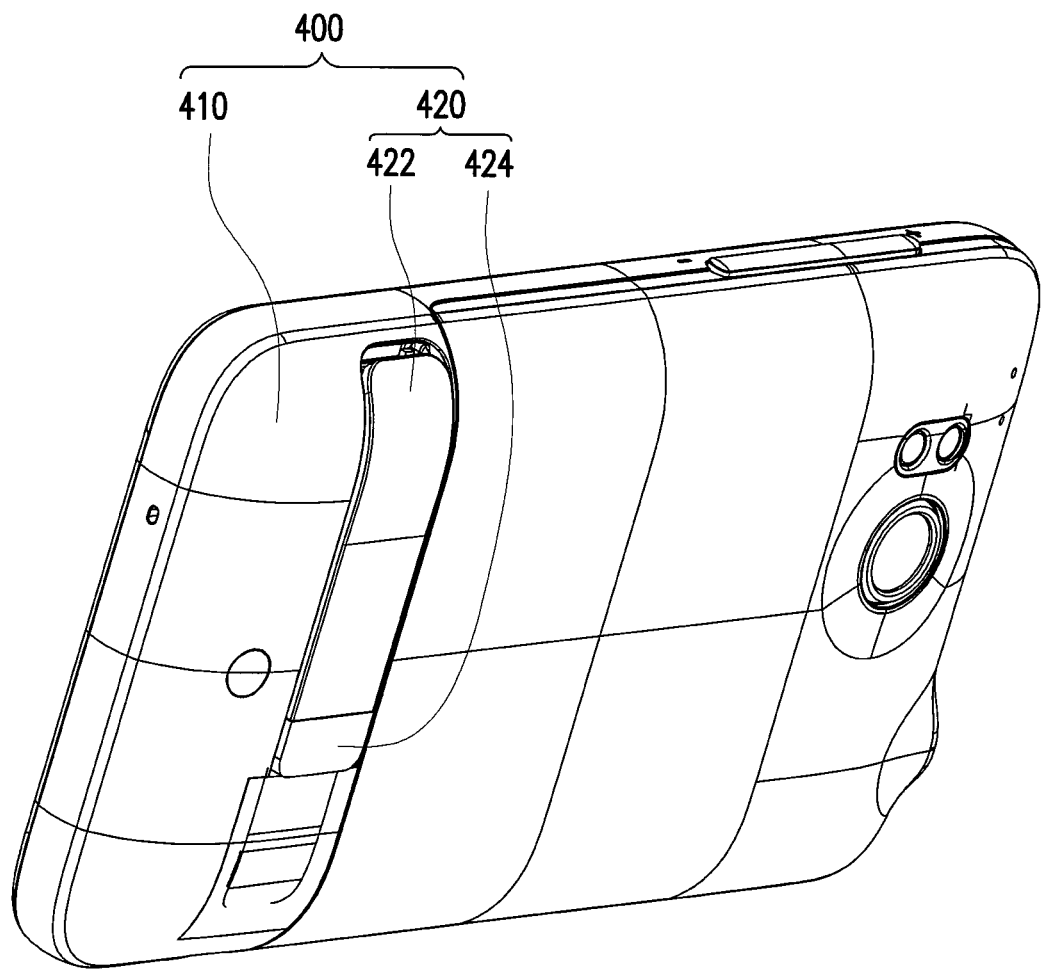
FIG. 6A and FIG. 6B are schematic views illustrating that the support stand in the standable hand-held device depicted in FIG. 5 is rotated on the hand-held device.
Figure 6B:
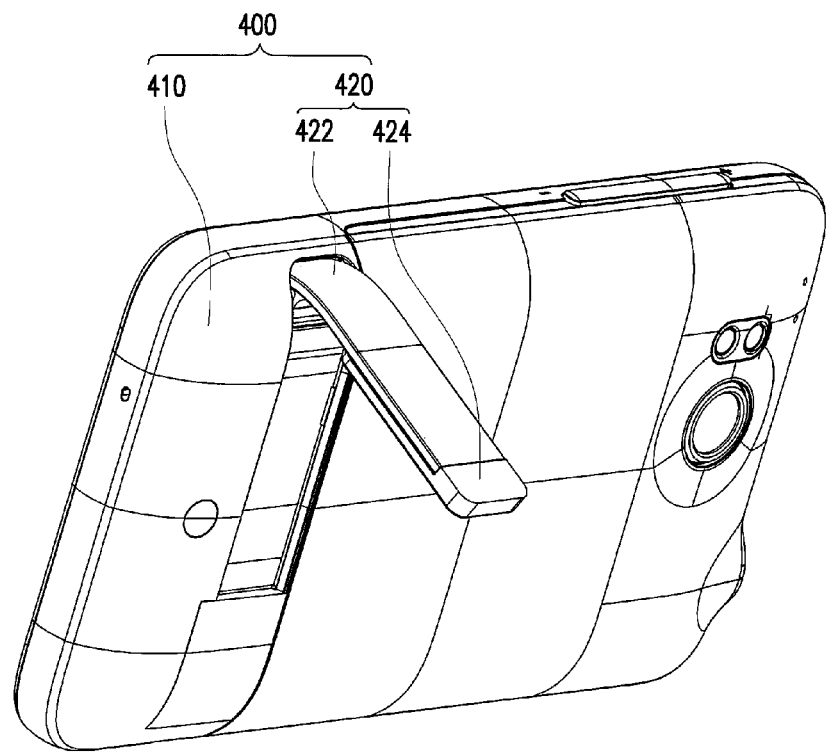

FIG. 6A and FIG. 6B are schematic views illustrating that the support stand in the standable hand-held device depicted in FIG. 5 is rotated on the hand-held device. With reference to FIG. 6A and FIG. 6B, the support stand 420 leans against the hand-held device 410. When it is intended to use the hand-held device 410, the support stand 420 is rotated relative to the hand-held device 410, such that one end of the support stand 420 is moved away from the hand-held device 410, as indicated in FIG. 6B. At this time, an angle is included between the support stand 420 and the hand-held device 410, and thus the standable hand-held device 400 can be placed on a table.

Figure 7A:
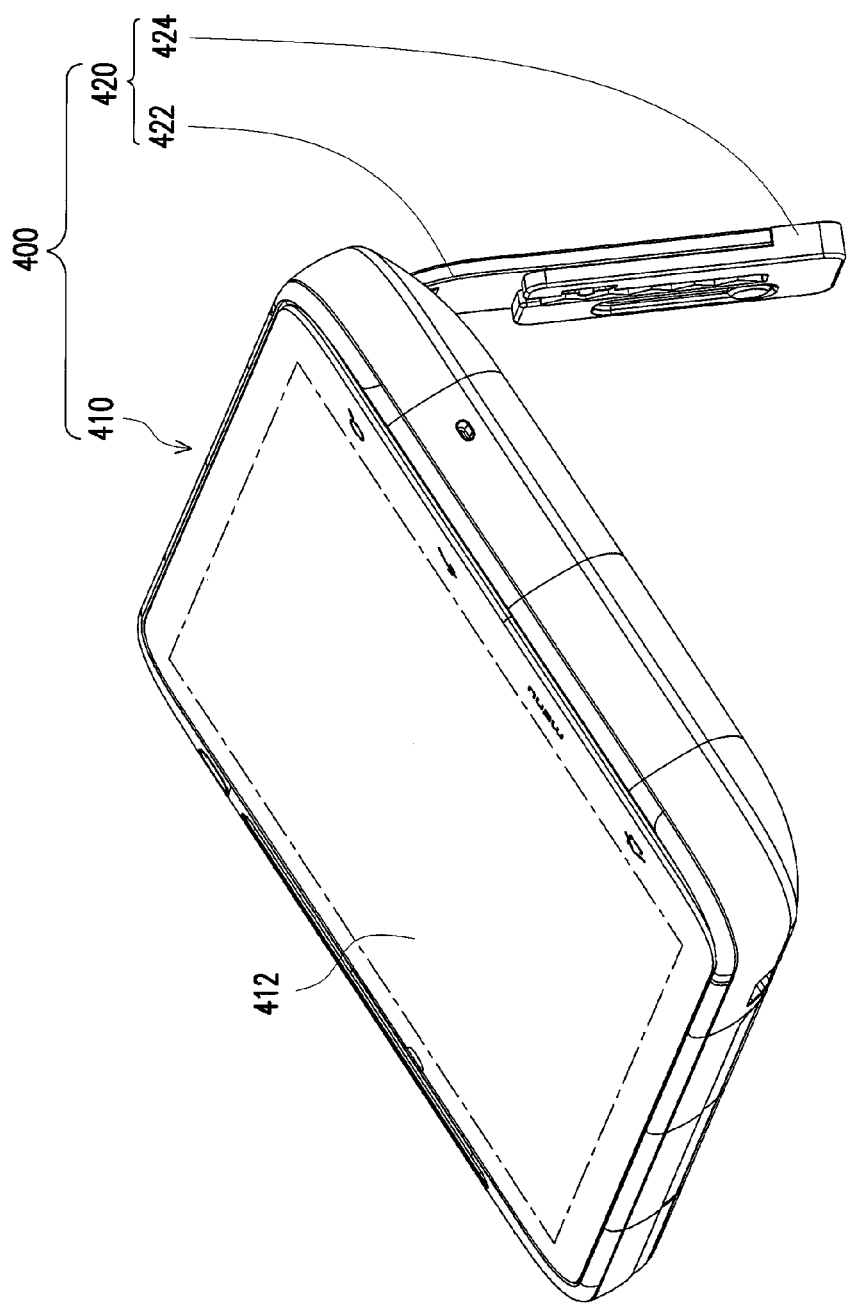
FIG. 7A to FIG. 7C are schematic views illustrating variations in lengths of the support stand in the standable hand-held device depicted in FIG. 6B.
Figure 7B:
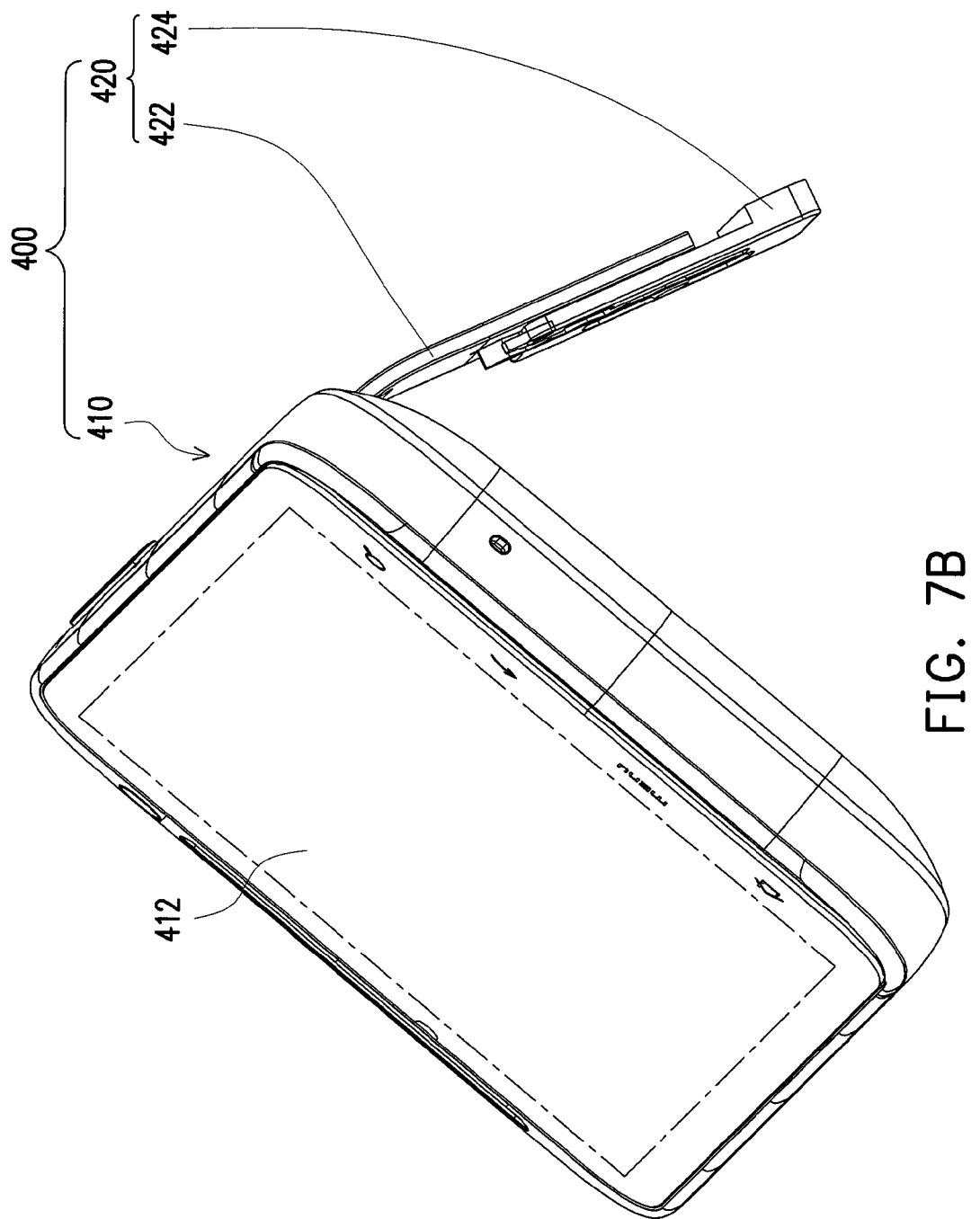
Figure 7C:
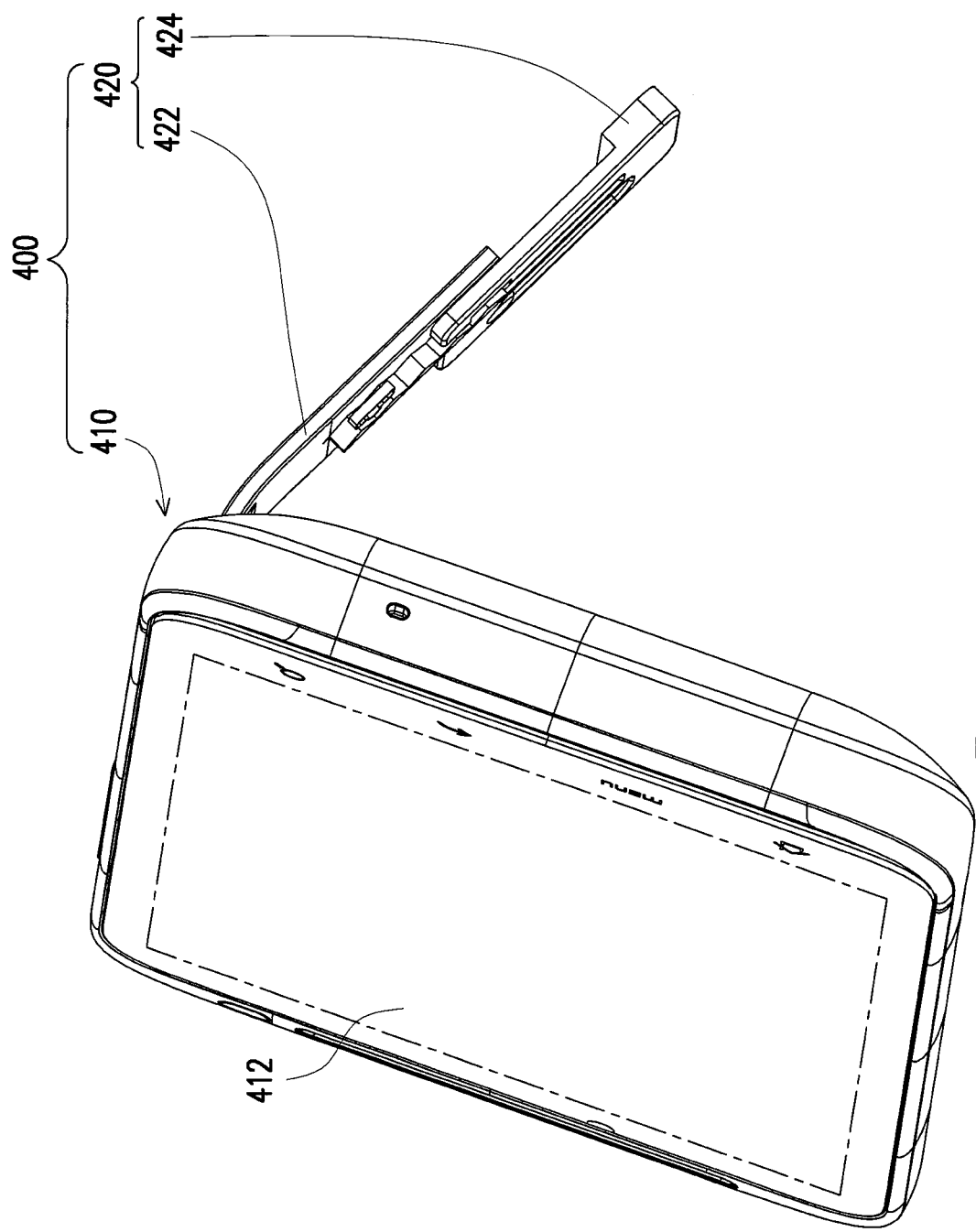

FIG. 7A to FIG. 7C are schematic views illustrating variations in lengths of the support stand in the standable hand-held device depicted in FIG. 6B. As shown in FIG. 7A to FIG. 7C, if it is intended to place the display screen 412 of the hand-held device 410 at different inclination angles on the table, the position of the second support member 424 can be adjusted relative to the position of the first support member 422, so as to extend or shorten the support stand 420. Accordingly, a user can easily adjust the inclination angle of the display screen 412 relative to the desktop based on personal preferences, and it is no longer necessary for the user to accommodate himself or herself to the display screen 412 at the fixed inclination angle relative to the desktop.

Figure 8:
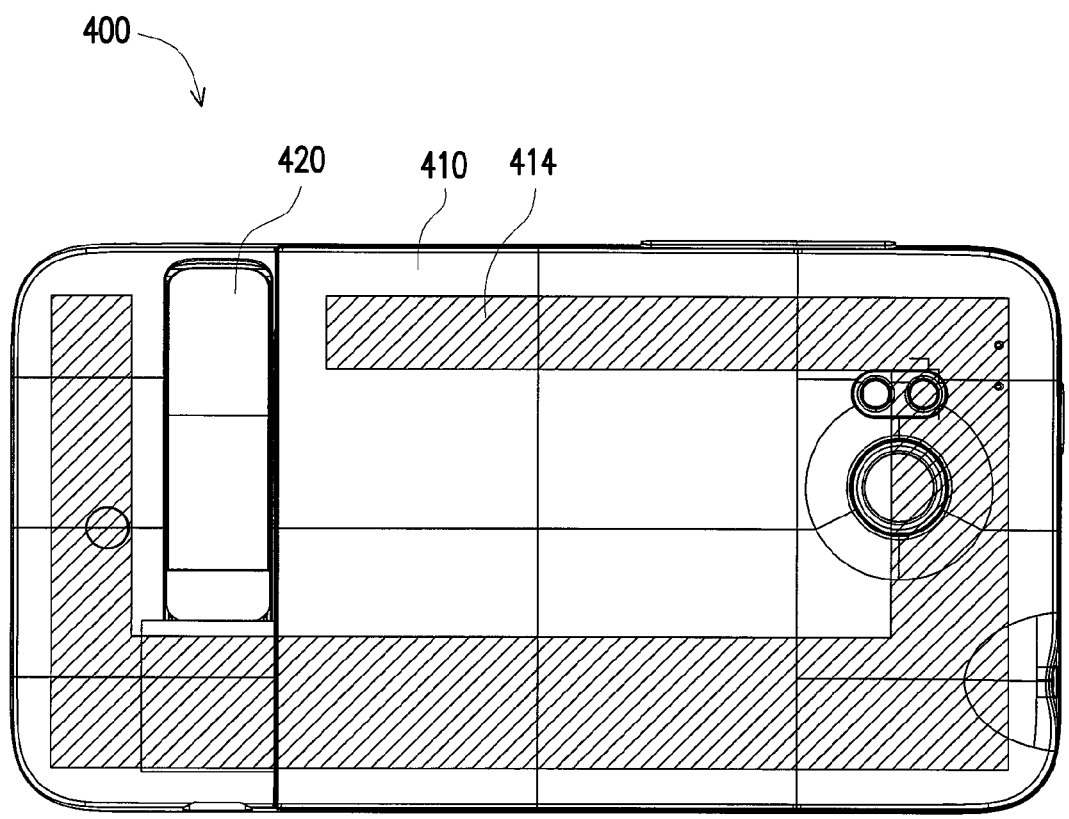
FIG. 8 is a schematic view illustrating locations of the antenna and the support stand in the hand-held device depicted in FIG. 6A.

FIG. 8 is a schematic view illustrating locations of the antenna and the support stand in the standable hand-held device depicted in FIG. 6A. With reference to FIG. 8, in this embodiment, the hand-held device 410 has an antenna 414. When the support stand 420 leaning against the hand-held device 410 has the minimum length, a projection of the support stand 420 on a plane where the display screen 412 is located is not overlapped with a projection of the antenna 414 on the plane where the display screen 412 is located. Through the aforesaid configuration, even though the support stand 420 is made of metal, and the distance between the support stand 420 and the antenna 412 is relatively short because the support stand 420 leans against the hand-held device 410, the antenna 414, when receiving or sending signals, is not significantly interfered because the projections of the support stand 420 and the antenna 414 are not overlapped.

In light of the foregoing, the support stand described in the embodiments of the invention can be adjusted to have different lengths, such that the hand-held device can be placed at various inclination angles on the table. Moreover, when the support stand leaning against the hand-held device has the minimum length, the projection of the support stand on the display screen is not overlapped with the projection of the antenna on the display screen, so as to reduce the influence of the support stand on the antenna.

It will be apparent to those skilled in the art that various modifications and variations can be made to the structure of the disclosure without departing from the scope or spirit of the invention. In view of the foregoing, it is intended that the disclosure cover modifications and variations of this invention provided they fall within the scope of the following claims and their equivalents.

What is claimed is:

1. A support stand suitable for being configured on a hand-held device, the support stand comprising:
   a first support member having a first positioning portion, a first guiding element, and a plurality of first locking portions; and
   a second support member slidably fitting the first support member, the second support member having a second positioning portion, a second guiding element, and a second locking portion, wherein the second positioning portion slidably fits the first positioning portion, so as to limit the second support member to slide on the first support member, the second guiding element slidably fits the first guiding element, such that the second support member slides along a sliding axis relative to the first support member, the second locking portion is capable of being locked to one of the first locking portions to adjust a position of the second support member relative to the first support member, and the second positioning portion is configured at one side of the second guiding element; and a first restoring element disposed between the first support member and the hand-held device to restore the first support member to the hand-held device, wherein the first restoring element is a torsion spring,
   wherein when the second support member slides on the first support member, a total length of projections of the first support member and the second support member on a plane which the first support member is located is changed,
   wherein the first positioning portion is a protrusion, the second positioning portion is a groove, the protrusion is located in the groove and has a top portion, and any outer diameter of the top portion is greater than a width of the groove so as to prevent the protrusion from exiting the groove.

2. The support stand as recited in claim 1, wherein an arrangement direction of the first locking portions is parallel to the sliding axis.

3. The support stand as recited in claim 1, wherein a length of the groove defines a sliding range of the second support member relative to the first support member.

4. The support stand as recited in claim 1, wherein the first locking portions are located on the first guiding element.

5. The support stand as recited in claim 4, wherein the first guiding element is a sliding block, and each of the first locking portions is a slot.

6. The support stand as recited in claim 1, wherein the first guiding element is a sliding block, the second guiding element is a sliding groove, the sliding block is located in the sliding groove, and an extension direction of the sliding groove is substantially parallel to the sliding axis.

7. The support stand as recited in claim 5, wherein the second locking portion is an elastic member, and the elastic member is capable of being locked to one of the slots.

8. The support stand as recited in claim 1, wherein the first support member is pivoted to the hand-held device.

9. The support stand as recited in claim 1, further comprising:
a fixing element fixed to the hand-held device, the first support member being pivoted to the hand-held device.

10. The support stand as recited in claim 9, further comprising:
a second restoring element disposed between the first support member and the fixing element to restore the first support member to the fixing element.

11. A standable hand-held device comprising:
a hand-held device having a display screen; and
a support stand comprising:
a first support member pivoted to the hand-held device; and
a second support member slidably fitting the first support member, the second support member being temporarily fixed at different positions on the first support member, so as to adjust the support stand to have different lengths; and a first restoring element disposed between the first support member and the hand-held device to restore the first support member to the hand-held device, wherein the first restoring element is a torsion spring,
wherein when the second support member slides on the first support member, a total length of projections of the first support member and the second support member on a plane which the first support member is located is changed,
wherein the first support member has a first positioning portion and a first guiding element, the second support member has a second positioning portion and a second guiding element, the second positioning portion slidably fits the first positioning portion, so as to limit the second support member to slide on the first support member, the second guiding element slidably fits the first guiding element, such that the second support member slides along a sliding axis relative to the first support member, the second positioning portion is configured at one side of the second guiding element, the first positioning portion is a protrusion, the second positioning portion is a groove, the protrusion is located in the groove and has a top portion, and any outer diameter of the top portion is greater than a width of the groove so as to prevent the protrusion from exiting the groove.

12. The standable hand-held device as recited in claim 11, the first support member having a plurality of first locking portions, the second support member having a second locking portion, wherein the second locking portion is capable of being locked to one of the first locking portions to adjust a position of the second support member relative to the first support member.

13. The standable hand-held device as recited in claim 12, wherein an arrangement direction of the first locking portions is parallel to the sliding axis.

14. The standable hand-held device as recited in claim 11, wherein a length of the groove defines a sliding range of the second support member relative to the first support member.

15. The standable hand-held device as recited in claim 12, wherein the first locking portions are located on the first guiding element.

16. The standable hand-held device as recited in claim 15, wherein the first guiding element is a sliding block, and each of the first locking portions is a slot.

17. The standable hand-held device as recited in claim 12, wherein the first guiding element is a sliding block, the second guiding element is a sliding groove, the sliding block is located in the sliding groove, and an extension direction of the sliding groove is substantially parallel to the sliding axis.

18. The standable hand-held device as recited in claim 16, wherein the second locking portion is an elastic member, and the elastic member is capable of being locked to one of the slots.

19. The standable hand-held device as recited in claim 12, wherein the first support member is pivoted to the hand-held device.

20. The standable hand-held device as recited in claim 12, further comprising:
a fixing element fixed to the hand-held device, the first support member being pivoted to the hand-held device.

21. The standable hand-held device as recited in claim 20, further comprising:
a second restoring element disposed between the first support member and the fixing element to restore the first support member to the fixing element.

22. The standable hand-held device as recited in claim 11, the hand-held device having an antenna, wherein when the support stand leaning against the hand-held device has a minimum length, a projection of the support stand on a plane where the display screen is located is not overlapped with a projection of the antenna on the plane where the display screen is located.

23. The standable hand-held device as recited in claim 22, wherein the first support member is made of metal, the second support member is made of metal, or the first and second support members are both made of metal.

24. A standable hand-held device comprising:
a hand-held device having a display screen and an antenna; and
a support stand pivoted to the hand-held device, wherein when the support stand leans against the hand-held device, a projection of the support stand on a plane where the display screen is located is not overlapped with a projection of the antenna on the plane where the display screen is located,
wherein the support stand comprises a first support member pivoted to the hand-held device and a second support member slidably fitting the first support member, the first support member has a first positioning portion and a first guiding element, the second support member has a second positioning portion and a second guiding element, the second positioning portion slidably fits the first positioning portion, so as to limit the second support member to slide on the first support member, the first positioning portion is a protrusion, the second positioning portion is a groove, the protrusion is located in the groove and has a top portion, any outer diameter of the top portion is greater than a width of the groove so as to prevent the protrusion from exiting the groove, the second guiding element slidably fits the first guiding element, such that the second support member slides along a sliding axis relative to the first support member, and the second positioning portion is configured at one side of the second guiding element, wherein when the second support member slides on the first support member, a total length of projections of the first support member and the second support member on a plane which the first support member is located is changed; and a restoring element disposed between the first support member and the hand-held device to restore the first support member to the hand-held device, wherein the restoring element is a torsion spring.

25. The standable hand-held device as recited in claim 24, wherein at least one portion of the support stand is made of metal.

26. The standable hand-held device as recited in claim 24, wherein the support stand is a stretchable support stand and has different lengths upon adjustment, and when the support stand leaning against the hand-held device has a minimum length of the different lengths, the projection of the support stand on the plane where the display screen is located is not overlapped with the projection of the antenna on the plane where the display screen is located.

* * * * *